US012683608B2

(12) United States Patent
Luo et al.

(10) Patent No.: US 12,683,608 B2
(45) Date of Patent: Jul. 14, 2026

(54) CHARACTERIZING SELF-HEATING OF LOGIC-CLOCK-BUFFERS (LCBS)

(71) Applicant: International Business Machines Corporation, Armonk, NY (US)

(72) Inventors: Lan Luo, South Burlington, VT (US); Richard Andre Wachnik, Mount Kisco, NY (US); Blaine Jeffrey Gross, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 18/801,952

(22) Filed: Aug. 13, 2024

(65) Prior Publication Data

US 2026/0051890 A1     Feb. 19, 2026

(51) Int. Cl.
*H03K 19/003* (2006.01)
*H03K 3/03* (2006.01)

(52) U.S. Cl.
CPC ......... *H03K 19/003* (2013.01); *H03K 3/0315* (2013.01)

(58) Field of Classification Search
CPC ........................... H03K 19/003; H03K 3/0315
See application file for complete search history.

(56) References Cited

U.S. PATENT DOCUMENTS

| | | | | |
|---|---|---|---|---|
| 7,425,871 | B2 * | 9/2008 | Gao | H03F 1/52 330/289 |
| 8,108,175 | B2 | 1/2012 | Chen et al. | |
| 8,412,487 | B2 | 4/2013 | Hyde et al. | |
| 10,019,545 | B2 | 7/2018 | Jeng et al. | |
| 2008/0112458 | A1 | 5/2008 | Wang et al. | |
| 2014/0077856 | A1 * | 3/2014 | Sofer | H03K 3/011 327/219 |
| 2019/0294748 | A1 | 9/2019 | Jeon et al. | |

FOREIGN PATENT DOCUMENTS

WO            9621950 A1        7/1996

OTHER PUBLICATIONS

Zhao, et al., "Impact of Self-heating Effect on Transistor Characterization and Reliability Issues in Sub-10 nm Technology Nodes", IEEE, 2018, 7 pages.

* cited by examiner

*Primary Examiner* — Jeffrey M Shin
(74) *Attorney, Agent, or Firm* — CANTOR COLBURN LLP; Teddi Maranzano

(57) ABSTRACT

A split-logic-clock-buffer (split-LCB) includes an input clock stage configured to receive an input clock signal, an output drive stage configured to output an output clock signal, and a clock distribution network interposed between the input clock stage and the output drive stage. The clock distribution network is configured to route the input clock signal to the drive output stage. The output drive stage includes an temperature sense circuit region that splits the output drive stage into an upstream drive portion and a downstream drive portion.

20 Claims, 6 Drawing Sheets

CHARACTERIZING SELF-HEATING OF LOGIC-CLOCK-BUFFERS (LCBS)

BACKGROUND

The present disclosure relates to integrated circuit design, and more specifically, to characterizing self-heating of logic-clock-buffers (LCBs) in an integrated circuit.

Logic-clock buffers (LCBs) play an important role in integrated circuits (ICs) by ensuring reliable distribution of clock signals throughout the IC. For example, LCBs are designed to input a clock signal and generate multiple synchronized outputs while minimizing timing skew between different circuit portions of the IC.

When LCBs operate, they consume electrical power through switching activities (e.g., performed by transistors and/or latches), which cause self-heating and temperature rise within the IC. The self-heating and temperature rise may alter the electrical characteristics of the IC components, which can affect the speed at which the signals propagate through the split-LCBs. In addition, temperature increases within the IC can enhance reliability degradation mechanisms such as electromigration, stress migration, bias temperature degradation, dielectric breakdown and hot carrier degradation, any or all of which may lead to early failure of the IC component.

SUMMARY

According to a non-limiting embodiment, a split-logic-clock-buffer (split-LCB) includes an input clock stage configured to receive an input clock signal, an output drive stage configured to output an output clock signal, and a clock distribution network interposed between the input clock stage and the output drive stage. The clock distribution network is configured to route the input clock signal to the drive output stage. The output drive stage includes an temperature sense circuit region that splits the output drive stage into an upstream drive portion and a downstream drive portion. According to another non-limiting embodiment, a self-heating logic-clock-buffer (LCB) characterization circuit comprises a plurality of split-logic-clock-buffers (split-LCBs). Each of the split-LCBs comprises an output drive stage including an temperature sense circuit region interposed between an upstream drive portion and a downstream drive portion. An inverter circuit is embedded in the temperature sense circuit region, wherein the inverter circuit of each of the split-LCBs are connected together to establish a ring oscillator circuit According to yet another non-limiting embodiment, a method of characterizing self-heating loss performance of split-logic-clock-buffers (split-LCBs) in an integrated circuit (IC). The method comprises delivering an input clock signal to an input clock stage, and routing the input clock signal from the input clock stage to a drive output stage using a clock distribution. The output drive stage includes an temperature sense circuit region that contains an inverter circuit and that splits the output drive stage into an upstream drive portion and a downstream drive portion. Based at least in part on the input signal, an output clock signal is output from the output drive stage which produces an increase in temperature of the output stage. The inverter circuit realizes a temperature change in response increasing the temperature of the output stage, and the self-heating loss performance of the split-LCBs is characterized based at least in part on the temperature change of the inverter circuit.

The above features and advantages, and other features and advantages, of the disclosure are readily apparent from the following detailed description when taken in connection with the accompanying drawings.

BRIEF DESCRIPTION OF THE DRAWINGS

The specifics of the exclusive rights described herein are particularly pointed out and distinctly claimed in the claims at the conclusion of the specification. The foregoing and other features and advantages of one or more embodiments described herein are apparent from the following detailed description taken in conjunction with the accompanying drawings in which:

Figure 1:
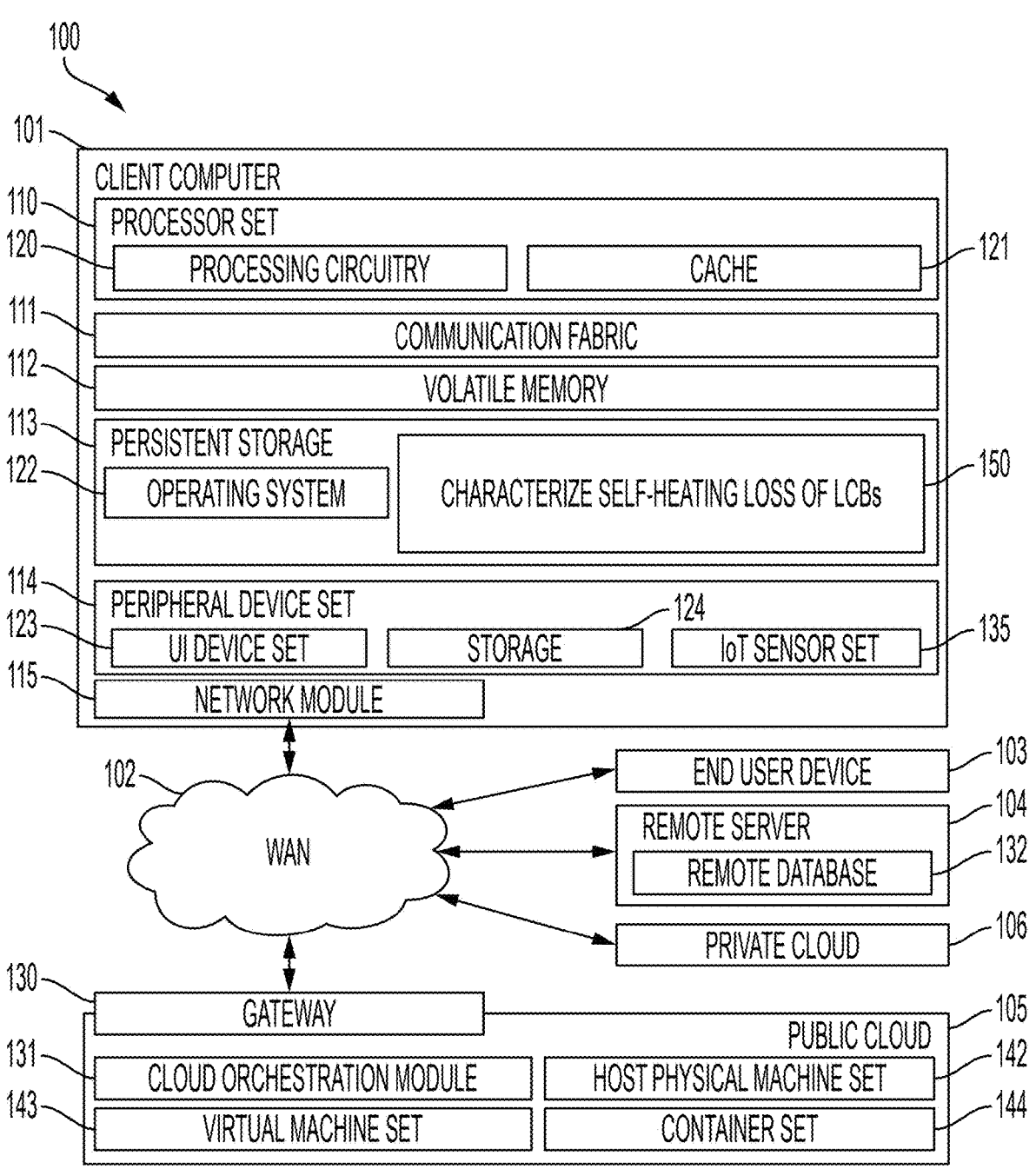
FIG. 1 illustrates a computing environment according to a non-limiting embodiment of the present disclosure.

The detailed description explains embodiments of the disclosure, together with advantages and features, by way of example with reference to the drawings.

DETAILED DESCRIPTION

The logic-timing of high-performance logic circuits and other high-load-factor drive circuits is critically dependent on temperature-rise and self-heating effects. This applies particularly to LCB circuits which can have high-duty-cycle and which drive large output loads where device self-heating can be extreme. Prediction of timing-effects has traditionally relied on detailed device-level modeling.

One or more embodiments described herein address these and other shortcomings by providing a self-heating LCB characterization circuit configured to characterize self-heating loss performance of LCBs in an IC. The self-heating LCB characterization circuit allows for directly analyzing timing-effects by characterizing critical logic-path delays embedded within LCB circuits, as well as in close proximity to LCB circuits. According to a non-limiting embodiment, a self-heating LCB characterization circuit integrates split-LCDs that implement an integrated inverter circuit. The integrated inverter circuit of each split-LCD can be connected together to establish a logic-path-delay characterization circuit that facilitates the characterization of logic-timing effects due to self-heating of the LCB circuits. In a non-limiting embodiment, the integrated inverter circuits included in a plurality of split-LCBs can be connected to establish a ring-oscillator that serves as a logic-path-delay characterization circuit. Varying the duty-cycle of the LCB circuits thru global-clock cycle-time variation and LCB-pulse-width-variation will be used to vary the self-heating temperature of the LCBs from ambient up to very high temperatures.

Descriptions of various embodiments of the present disclosure are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random-access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

With reference now to FIG. 1 an example computing environment 100 for use in conjunction with one or more embodiments of the present disclosure is illustrated according to a non-limiting embodiment of the present disclosure. The computing environment 100 contains an example of an environment for the execution of at least some of the computer code involved in performing the inventive methods, such as characterizing loss in performance caused by self-heating of LCBs in an IC, referred to herein as "self-heating loss performance", as shown at block 150.

In addition to block 150, computing environment 100 includes, for example, computer 101, wide area network (WAN) 102, end user device (EUD) 103, remote server 104, public Cloud 105, and private Cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI), device set 123, storage 124, and Internet of Things (IoT) sensor set 125), and network module 115. Remote server 104 includes remote database 132. Public Cloud 105 includes gateway 130, Cloud orchestration module 131, host physical machine set 142, virtual machine set 143, and container set 144.

COMPUTER 101 may take the form of a desktop computer, laptop computer, tablet computer, smart phone, smart watch or other wearable computer, mainframe computer, quantum computer, a small single board computer (e.g. a Raspberry Pi) or any other form of computer or mobile device now known or to be developed in the future that is capable of running a program, accessing a network or querying a database, such as remote database 132. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a Cloud, even though it is not shown in a Cloud in FIG. 1. On the other hand, computer 101 is not required to be in a Cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid-state storage devices. Operating system 122 may take several forms, such as various known proprietary operating systems or open-source Portable Operating System Interface type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collects and store helpful and useful data for use by other computers, such as computer 101. For example, in a hypothetical case where computer 101 is designed and programmed to provide a recommendation based on historical data, then this historical data may be provided to computer 101 from remote database 132 of remote server 104.

PUBLIC CLOUD 105 is any computer system available for use by multiple entities that provides on-demand availability of computer system resources and/or other computer capabilities, especially data storage (Cloud storage) and computing power, without direct active management by the user. Cloud computing typically leverages the sharing of resources to achieve coherence and economies of scale. The direct and active management of the computing resources of public Cloud 105 is performed by the computer hardware and/or software of Cloud orchestration module 131. The computing resources provided by public Cloud 105 are typically implemented by virtual computing environments that run on various computers making up the computers of host physical machine set 142, which is the universe of physical computers in and/or available to public Cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after the instantiation of the VCE. Cloud orchestration module 131 manages the transfer and storage of images, deploys new instantiations of VCEs, and manages active instantiations of VCE deployments. Gateway 130 is the collection of computer software, hardware, and firmware that allows public Cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public Cloud 105, except that the computing resources are only available for use by a single enterprise. While private Cloud 106 is depicted as being in communication with WAN 102, in other embodiments a private Cloud may be disconnected from the internet entirely and only accessible through a local/private network. A hybrid Cloud is a composition of multiple Clouds of different types (for example, private, community, or public Cloud types), often respectively implemented by different vendors. Each of the multiple Clouds remains a separate and discrete entity, but the larger hybrid Cloud architecture is bound together by standardized or proprietary technology that enables orchestration, management, and/or data/application portability between the multiple constituent Clouds. In this embodiment, public Cloud 105 and private Cloud 106 are both part of a larger hybrid Cloud.

Figure 2:
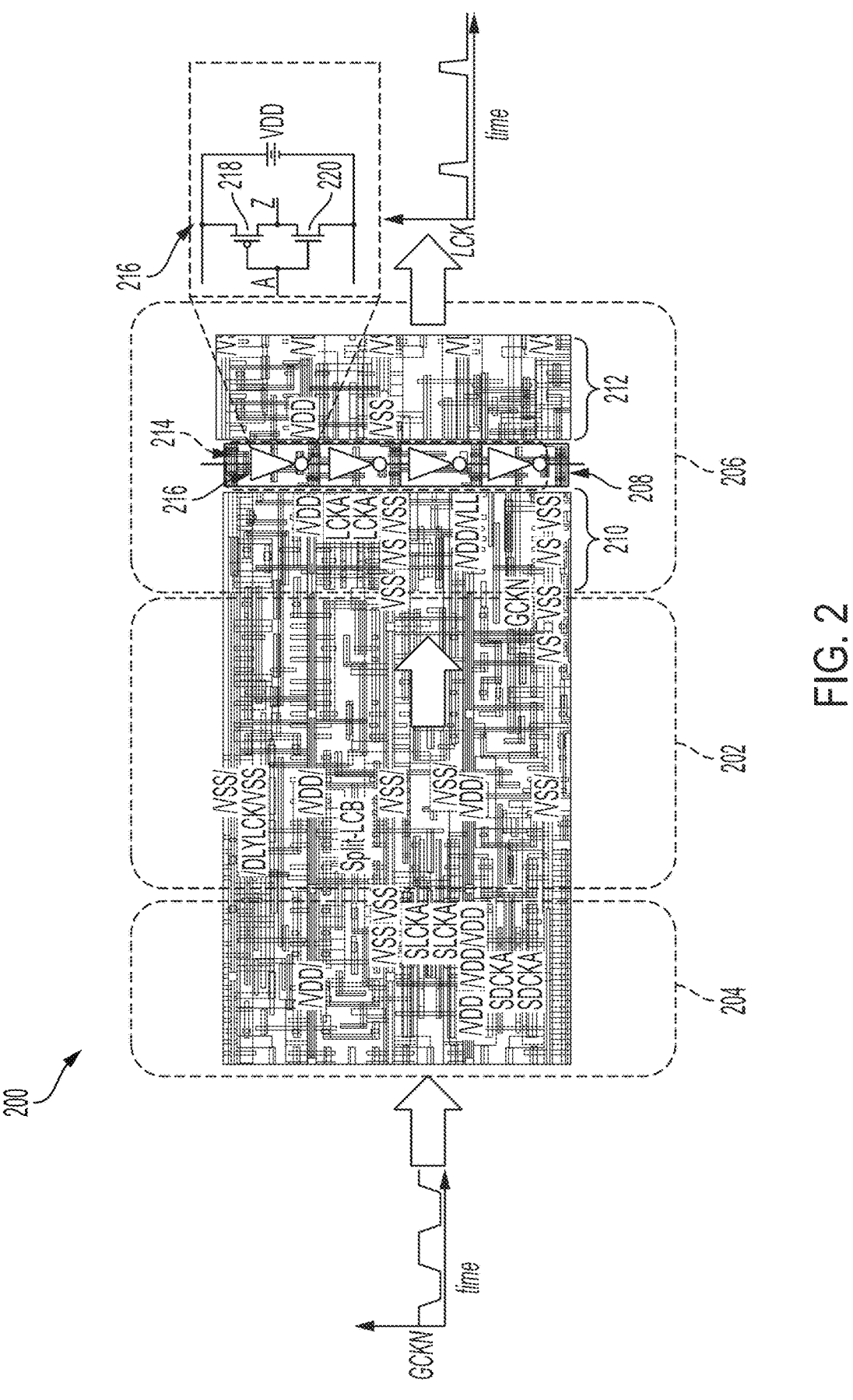
FIG. 2 depicts a split-LCB that can be implemented in a self-heating LCB characterization circuit configured to characterize self-heating loss performance according to a non-limiting embodiment of the present disclosure.

Referring now to FIG. 2, a split-LCB 200 that can be implemented in a self-heating LCB characterization circuit configured to characterize self-heating loss performance is illustrated according to a non-limiting embodiment of the present disclosure. The split-LCB 200 a clock distribution network 202 interposed between an input clock stage 204 and an output drive stage 206.

The input clock stage 204 receives an input clock signal, e.g., a global clock input signal (GCKN), having a first frequency and first phase. The input clock stage 204 can include circuitry to condition the input clock signal (GCKN)

such as, for example, impedance matching and/or level shifting, to ensure compatibility with the internal logic of the split-LCB 200.

The clock distribution network 202 can include a network of traces and connections configured to route the input clock signal (GCKN) from the input clock stage 204 to the output drive stage 206. In one or more embodiments, the clock distribution network 202 can include circuitry (e.g., multiplexers, dividers, routing switches, latches, transistors, etc.) that routes the input clock signal (GCKN) with minimal parasitic effects caused by capacitance and/or inductance.

The output drive stage 206 includes circuitry configured to provide an output clock signal (LCK) with a strength high enough to drive one or more target loads. For example, the output drive stage 206 can include circuitry that ensure voltage level of the output clock signal (LCK) remain stable and within target voltage limits. The output drive stage 206 can also include circuitry that maintains signal integrity by minimizing voltage drops, while ensuring fast rise and fall times of the output clock signal (LCK) that maintains a target clock frequency.

With continued reference to FIG. 2, the output drive stage 206 includes an temperature sense circuit region 208, which splits (i.e., interposed between) the output drive stage 206 into an upstream drive portion 210 (i.e., upstream from the temperature sense circuit region 208) and a downstream drive portion 212 (i.e., downstream from the temperature sense circuit region 208). The temperature sense circuit region 208 includes an inverter circuit 214 (e.g., an integrated inverter circuit), which is embedded in the circuitry of the output drive stage 206. The inverter circuit 214 includes a plurality of inverters 216 connected in series with one another. According to a non-limiting embodiment, the inverters 216 can be established using a connection of transistors including, but not limited to, field effect transistors (FETs), metal-oxide-semiconductor field-effect transistors (MOSFETs), bipolar junction transistors (BJTs), metal-gate-junction-FETs. For example, the inverters 216 can be established using a first field effect transistor (FET) 218 (e.g., a P-type FET 218) and a second FET 220 (e.g., a N-type FET 220) connected to establish a CMOS inverter circuit, as further shown in FIG. 2. According to another non-limiting embodiment, the inverters 216 can be established using a transistor 218 (e.g., a NPN transistor) with a collector resistor 220 connected to its collector and a base resistor 222 connected to its base. Other types of circuits can be utilized to establish the inverters such as, for example, micro-electro-mechanical systems (MEMs).

The inverters 206 are in close thermal contact with the output drive stage 206 so that both circuits are at the same temperature during operation. When the output drive stage devices 206 heat up, there will be a corresponding increase in temperature of the inverters connected in series 208. The change in temperature due to self-heating causes changes in device threshold voltages and current-draw, which affect the circuit operating speed. The inverter devices 208 will experience a change in signal delay which will be reflected in the ring-oscillator operating frequency.

Figure 3:
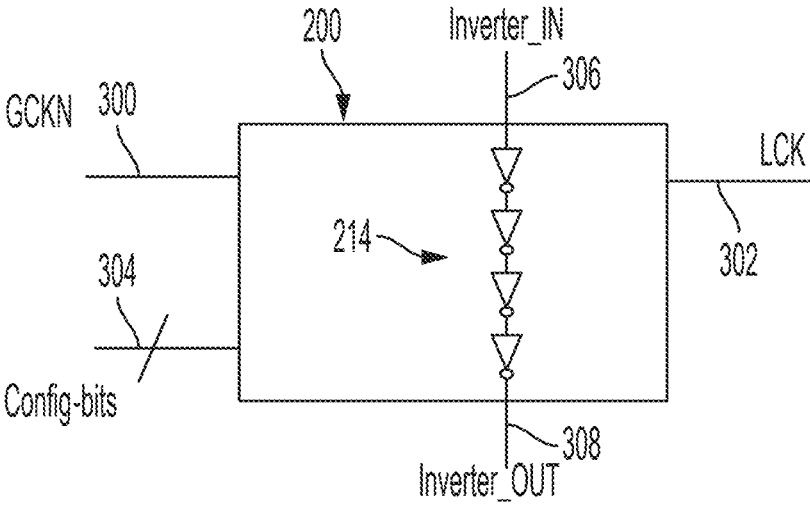
FIG. 3 is a schematic diagram of the split-LCB shown in FIG. 2.

FIG. 3 is a schematic diagram of the split-LCB 200 described herein. The split-LCB 200 includes an input clock terminal 300, an output clock terminal 302, a bit configuration terminal 304, an inverter input terminal 306, and an inverter output terminal 308. The input clock terminal 300 receives the input clock signal (GCKN), which is synthesized (e.g., by the clock distribution network 202) to generate a synthesized clock signal, which is then output as an output clock signal (LCK) at the output clock terminal 302.

The bit configuration terminal 304 can receive a configuration signal, which includes one or more bits that adjusts both the delay and pulse width of the output clock signal (LCK). For example, the "config-bit" input to the split-LCB 200 can be used to vary the pulse-width a small amount, thereby also varying the amount of heat generated by the split-LCB 200. The inverter input terminal 306 is configured to provide the output from one inverter circuit included in a first separate LCB (not shown) to the inverter circuit 214 of the split-LCB 200, and the inverter output terminal 308 is configured to deliver the inverter output of the inverter circuit 214 to another inverter circuit included in a second separate LCB (not shown). In this manner, the split-LCB 200 can be utilized to establish a ring oscillator circuit as described in greater detail below.

Figure 4:
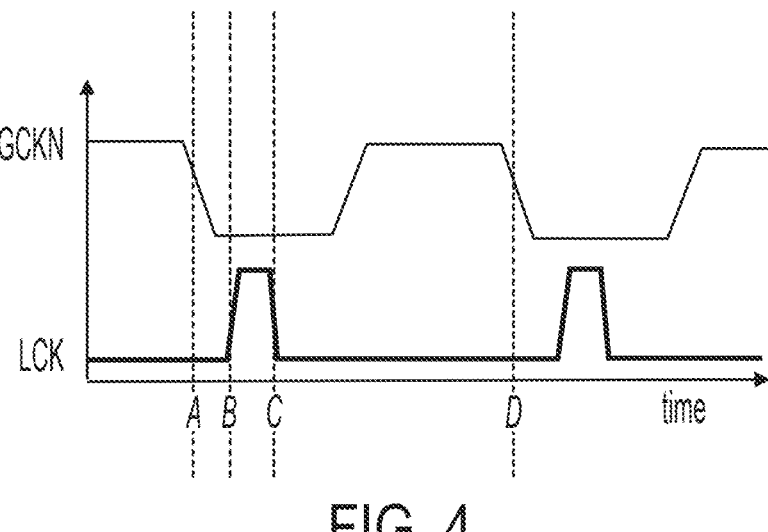
FIG. 4 is a signal diagram comparing the global clock signal input to the self-heating LCB characterization circuit to the output clock signal (LCK) generated by the self-heating LCB characterization circuit.

FIG. 4 depicts examples of a global clock signal (GCKN) provided to the input clock terminal 300 and the generated clock signal (LCK) output from the output clock terminal 302. According to a non-limiting embodiment, the input clock signal (GCKN) is a digital square-wave, which is synthesized to produce a buffered output (LCK) having the same frequency, but with a time delay, a change in pulse width, and a change in duty-cycle. The global clock signal (GCKN) includes falling edges (N), which trigger an action (e.g., switching event, latch event, etc.), which captures a timing event within the clock cycle. The global clock signal (GCKN) can span from time "A" when a first falling edge occurs, to time "D", marking a subsequent falling edge, thereby defining a complete cycle of the global clock signal (GCKN). The delay of the LCB output clock signal (LCK) is determined by the time difference between its rising edge at time "B" and the initial falling edge of GCK at time "A." The pulse width of the LCB output clock signal (LCK) corresponds to the time interval between its falling edge at time "C" and its rising edge at time "B." The duty cycle of the LCB output clock signal (LCK) is calculated as the ratio of its pulse width (time "C"-time "B") to the entire period of the global clock (time "D"-time "A"), offering a measure of its on-time relative to its cycle duration.

Figure 5:
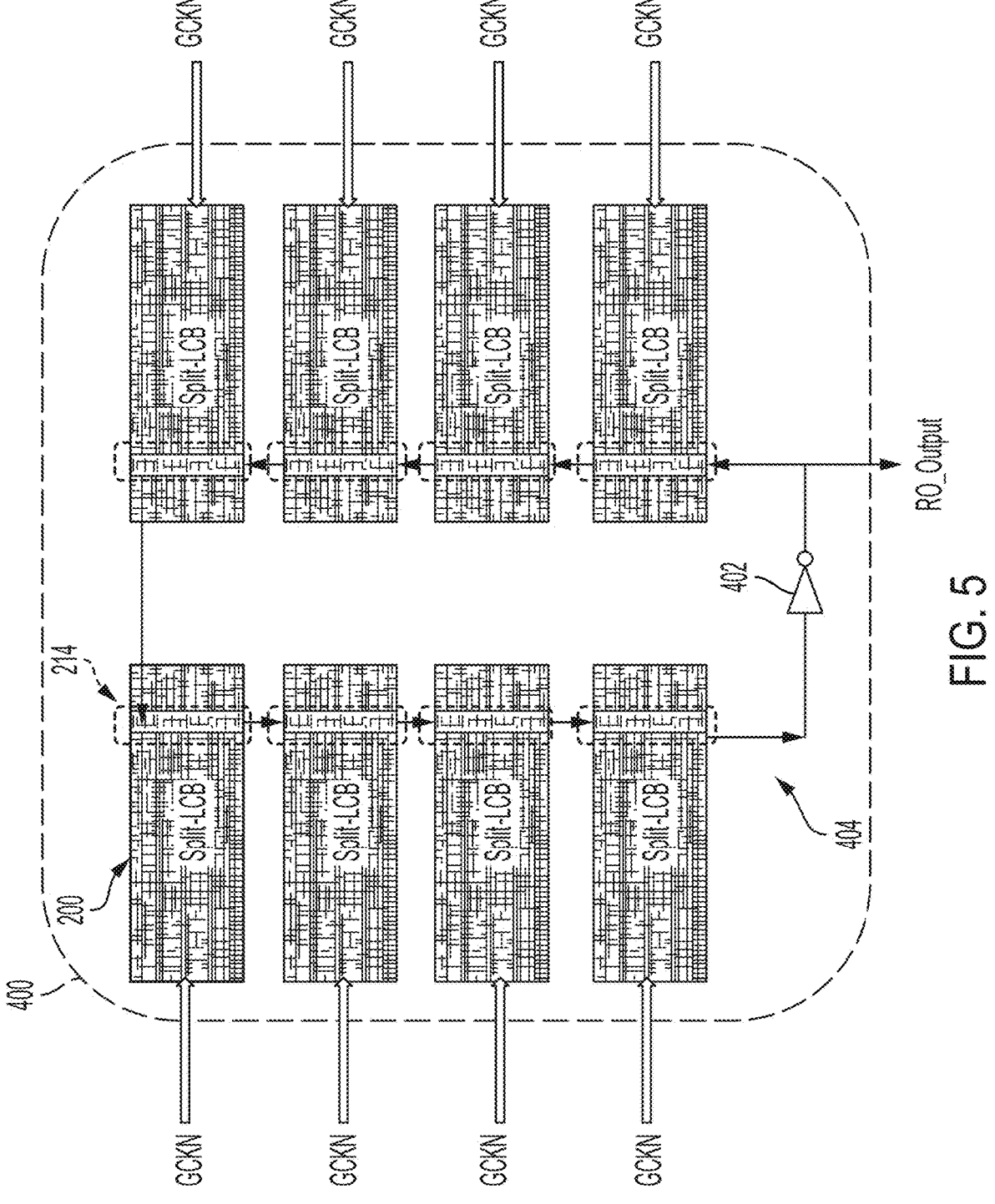
FIG. 5 depicts a self-heating LCB characterization circuit including a plurality of split-LCBs according to a non-limiting embodiment of the present disclosure.

Turning now to FIG. 5, a self-heating LCB characterization circuit 400 is illustrated according to a non-limiting embodiment of the present disclosure. The self-heating LCB characterization circuit 400 includes a plurality of split-LCBs 200 (e.g., a bank of split-LCBs 200) and a ring oscillator (RO) inverter 402. The ring oscillator (RO) inverter 402 and the inverter circuits 214 embedded in each of the split-LCBs 200 are connected in series to form a ring oscillator circuit 404, also referred to simply as a ring oscillator 404. In this example, the inverter circuits 214 include an even number of inverters (e.g., four inverters). Accordingly, the RO inverter 402 produces one extra inversion so that the gain traced around the loop is "−1".

The self-heating LCB characterization circuit 400 inputs a global clock input signal (GCKN) to each of the split-LCBs 200. According to an embodiment, the global clock input signal (GCKN) can be supplied using an off-chip equipment (e.g., an off-chip clock generator), which can vary the signal frequency so as to change the amount of heat generated by the split-LCBs 200. In another embodiment, the global clock input signal (GCKN) can be supplied using an on-chip oscillator circuit (e.g., an in-situ global clock "GCKN" ring oscillator) co-located with the rest of the self-heating LCB characterization circuit 400. In this embodiment, the in-situ GCKN ring-oscillator can be configured to vary its operating frequency in order to vary the amount of heat generated by the split-LCB circuits 200. In either embodiment, the heat induced by the global clock input signal (GCKN) will be emitted primarily by the output-devices of the split-LCBs 200 (e.g., the devices located in the output drive stage 206), and will heat the ring oscillator 404 so as to change or vary a speed at which clock signal(s) propagate through the split-LCBs 200 and current-draw of the split-LCBs 200. This change in speed and current-draw has a direct correlation to the heat emitted (e.g., the heat loss) by the split-LCBs 200. Therefore, the change in speed and current-draw can be measured at the RO output (RO_Output), e.g., by a controller (not shown) connected to RO_Output to determine the self-heating loss performance of LCBs 200.

Figure 6:
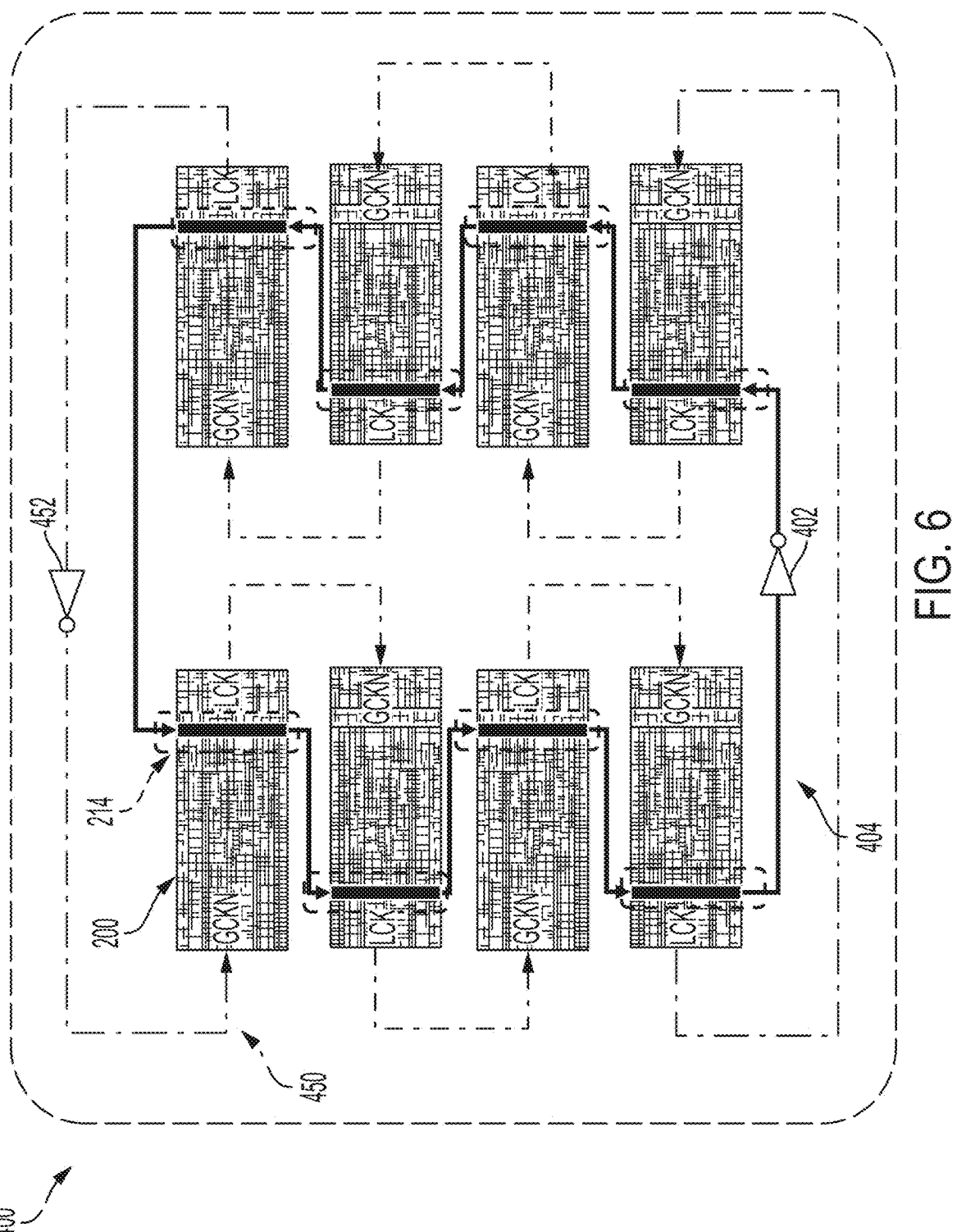
FIG. 6 depicts a self-heating LCB characterization circuit including a plurality of split-LCBs according to another non-limiting embodiment of the present disclosure.

FIG. 6 illustrates the self-heating LCB characterization circuit 400 according to another non-limiting embodiment. Instead of using a clock signal delivered by off chip equipment, the embodiment shown in FIG. 6 provides the global clock signal (GCKN) using an on-chip oscillator circuit 450 (e.g., an in-situ GCKN ring oscillator 450) co-located with the rest of the self-heating LCB characterization circuit 400. According to a non-limiting embodiment, the in-situ GCKN ring oscillator 450 is implemented by connecting the split-LCBs 200 in a self-timed LCB-daisy-chain configuration, where an output clock signal (LCK) of one split-LCB 200 is utilized as the input clock signal (GCKN) for a second split-LCB 200 located immediately downstream from the first split-LCB 200. The in-situ GCKN ring oscillator 450 further implements a GCKN inverter 452 that is connected in series between a first split-LCB 200 and a second split-LCB 200. The GCKN inverter 452 inputs the output clock signal (LCK) from the first split-LCB 200 and generates an inverted clock signal that is used as the input signal (GCKN) for the second split-LCB 200 located immediately downstream from the input clock signal (GCKN) 452. The gain of an even numbered array of split-LCB 200 is "+1". Accordingly, one additional inverter 452 operates to produce an extra inversion such that the in-situ GCKN ring oscillator 450 can oscillate.

Figure 7:
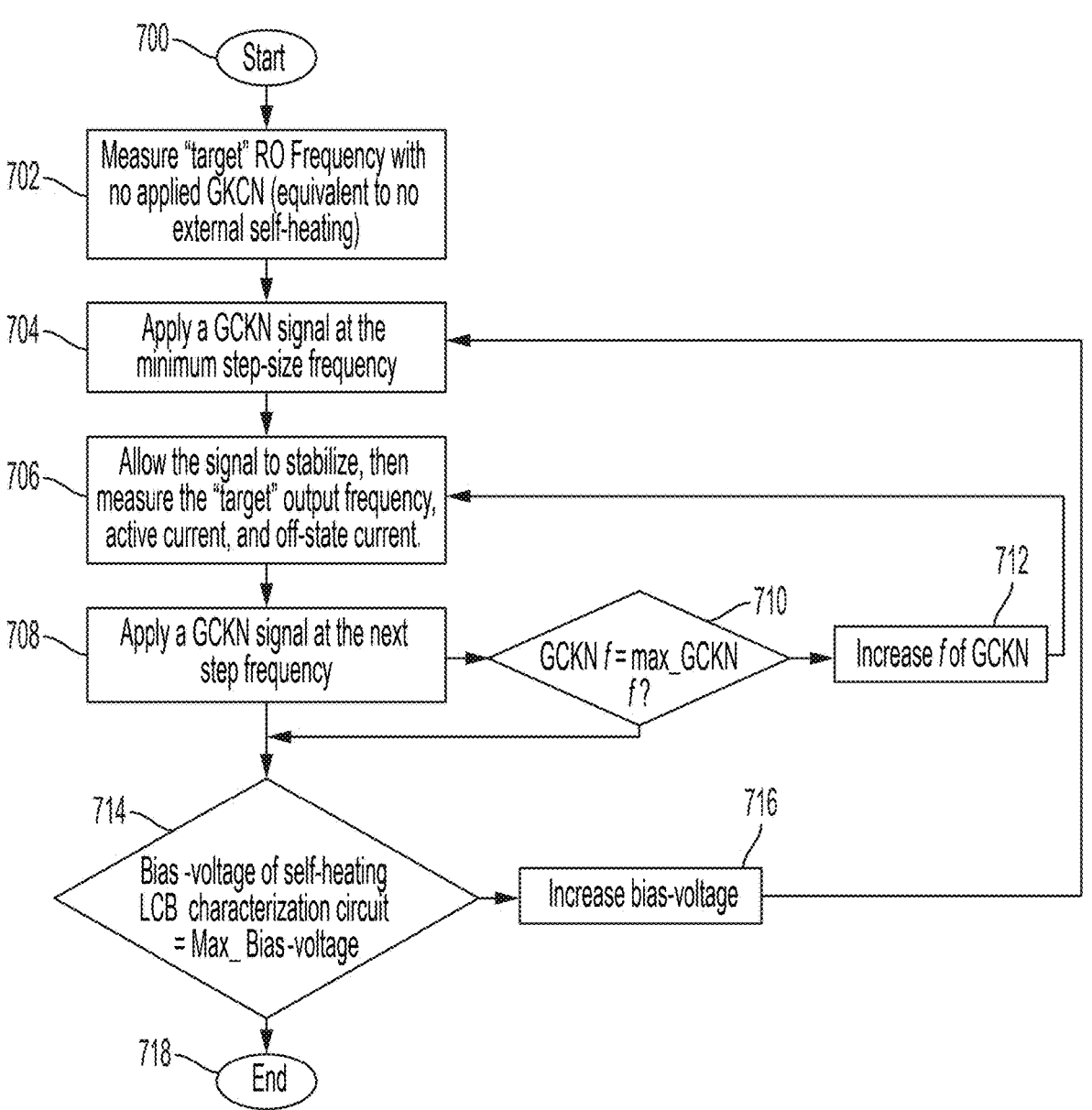
FIG. 7 is flow diagram illustrating a method characterizing self-heating loss performance of split-LCBs in an IC according to a non-limiting embodiment of the present disclosure.

FIG. 7 illustrates a method of characterizing self-heating loss performance of split-LCBs in an IC according to a non-limiting embodiment of the present disclosure. The method begins at operation 700, and at operation 702 a target RO frequency of the self-heating LCB characterization circuit 400 is measured when a global clock signal (GCKN) is not input to, i.e., when no self-heating occurs. The target RO frequency refers to a frequency that is expected to be measured at the output of the self-heating LCB characterization circuit 400 without alteration caused by self-heating of the split-LCBs included in the self-heating LCB characterization circuit 400. At operation 704, a global clock signal (GCKN) is input to the ring oscillator established by the self-heating LCB characterization circuit 400. The global clock signal (GCKN) can be initially applied at a minimum step-size frequency. According to a non-limiting embodiment, the global clock signal (GCKN) is supplied using an off-chip equipment that can vary the signal frequency so as to change (e.g., increase or decrease) the amount of heat generated by the split-LCBs 200 included in the self-heating LCB characterization circuit 400. After the global clock signal (GCKN) stabilized, the target output frequency, on-state (e.g., active) current, and the off-state current are measured (e.g., by a controller connected to the RO circuit output) at operation 706. At operation 708, the global clock signal (GCKN) is applied at the next step frequency (f). At operation 710, a determination is made as to whether the GCKN frequency (f) is at its max frequency (GCKN f). When the GCKN frequency (f) is not at its max frequency (GCKN f), the frequency (f) of the global clock signal (GCKN) is increased (e.g., stepped) by a set value and return to operation 706 and continues measuring the target output frequency, on-state (e.g., active) current, and the off-state current are measured.

When, however, the GCKN frequency (f) is at its max frequency (GCKN f), the frequency (f) of the global clock signal (GCKN) is maintained, and the method determines whether the bias-voltage of self-heating LCB characterization circuit is at is maximum bias voltage (Max_Bias-voltage) at operation 716. When the bias-voltage of self-heating LCB characterization circuit is not at the maximum bias voltage (Max_Bias-voltage), the bias-voltage is increased, and the method returns to operation 704. When, however, the bias-voltage of self-heating LCB characterization circuit is at the maximum bias voltage (Max_Bias-voltage), the method ends at operation 718.

As described herein, various embodiments of the present disclosure provide a system and method for characterizing self-heating loss performance of LCBs in an IC.

Various embodiments are described herein with reference to the related drawings. Alternative embodiments can be devised without departing from the scope of the present disclosure. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the present disclosure may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present disclosure may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A split-logic-clock-buffer (split-LCB) comprising:

an input clock stage configured to receive an input clock signal;

an output drive stage configured to output an output clock signal; and a clock distribution network interposed between the input clock stage and the output drive stage, the clock distribution network configured to route the input clock signal to the drive output stage, wherein the output drive stage includes an temperature sense circuit region that splits the output drive stage into an upstream drive portion and a downstream drive portion.

2. The split-LCB of claim 1, further comprising an inverter circuit embedded in the temperature sense circuit region.

3. The split-LCB of claim 2, wherein the inverter circuit includes a plurality of inverters.

4. The split-LCB of claim 3, wherein the plurality of inverters are constructed as transistors.

5. The split-LCB of claim 3, wherein the plurality of inverters includes an even number of inverters.

6. The split-LCB of claim 2, wherein:

the clock distribution network is configured to synthesize the input clock signal to generate a synthesized clock signal;

the upstream drive portion delivers the synthesized clock signal to the downstream drive portion; and the downstream drive portion outputs the output clock signal based at least in part on the synthesized clock signal.

7. The split-LCB of claim 6, wherein the input clock signal has a first pulse width and a first duty cycle, and the output clock signal has a second pulse width and a second duty cycle, and wherein one or both of the second pulse width and the second duty cycle is different from the first pulse width and the first duty cycle.

8. A self-heating logic-clock-buffer (LCB) characterization circuit comprising:

a plurality of split-logic-clock-buffers (split-LCBs), each of the split-LCBs comprising:

an output drive stage including an temperature sense circuit region interposed between an upstream drive portion and a downstream drive portion; and an inverter circuit embedded in the temperature sense circuit region, wherein the inverter circuit of each of the split-LCBs are connected together to establish a ring oscillator circuit.

9. The self-heating LCB characterization circuit of claim 8, wherein the ring oscillator circuit is established by generating an output signal from a first split-LCB and delivering the output signal to an input of a second split-LCB connected in series with the first split-LCB.

10. The self-heating LCB characterization circuit of claim 9, wherein an output from the ring oscillator circuit is configured to indicate an amount of heat emitted by the plurality of split-LCBs.

11. The self-heating LCB characterization circuit of claim 10, wherein each of the split-LCBs inputs a global clock input signal and outputs an output clock signal.

12. The self-heating LCB characterization circuit of claim 11, wherein the global clock input signal that is input to each of the split-LCBs is provided by an off-chip clock generator.

13. The self-heating LCB characterization circuit of claim 11, wherein the global clock input signal input to each of the split-LCBs is provided by an on-chip oscillator circuit.

14. The self-heating LCB characterization circuit of claim 13, wherein the on-chip oscillator circuit is an in-situ global clock ring oscillator.

15. A method of characterizing self-heating loss performance of split-logic-clock-buffers (split-LCBs) in an integrated circuit (IC), the method comprising:

delivering an input clock signal to an input clock stage;

routing the input clock signal from the input clock stage to a drive output stage using a clock distribution network, the output drive stage including an temperature sense circuit region that contains an inverter circuit and that splits the output drive stage into an upstream drive portion and a downstream drive portion; and based at least in part on the input signal, outputting an output clock signal from the output drive stage which produces an increase in temperature of the output stage, wherein the inverter circuit realizes a temperature change in response increasing the temperature of the output stage, and wherein the self-heating loss performance is characterized based at least in part on the temperature change of the inverter circuit.

16. The method of claim 15, wherein the temperature change includes an increase in temperature that corresponds to the increase in temperature of the output stage.

17. The method of claim 16, wherein the inverter circuit includes a plurality of inverters connected in series with one another to establish a ring-oscillator circuit that operates according to an operating frequency.

18. The method of claim 17, wherein the inverters realize a change in signal delay that causes a variation of the operating frequency, and wherein the self-heating loss performance is characterized based at least in part on the variation of the operating frequency.

19. The method of claim 17, wherein the temperature change causes a change in one or both of a device threshold voltage and current-draw of the inverters that causes a change in an operating speed of the ring-oscillator circuit, and wherein the self-heating loss performance is characterized based at least in part on the change in the operating speed of the ring-oscillator circuit.

20. The method of claim 15, wherein outputting the output clock signal further comprises:

synthesizing the input clock signal using the clock distribution network to generate a synthesized clock signal;

delivering the synthesized clock signal from the upstream drive portion to the downstream drive portion; and based at least in part on the synthesized clock signal, outputting the output clock signal from the downstream drive portion.

* * * * *